United States Patent
Yamaguchi et al.

(10) Patent No.: US 12,176,271 B2
(45) Date of Patent: *Dec. 24, 2024

(54) SEMICONDUCTOR DEVICE

(71) Applicant: ROHM CO., LTD., Kyoto (JP)

(72) Inventors: Atsushi Yamaguchi, Kyoto (JP);
Hiroyuki Sakairi, Kyoto (JP);
Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/496,036

(22) Filed: Oct. 27, 2023

(65) Prior Publication Data

US 2024/0055328 A1 Feb. 15, 2024

Related U.S. Application Data

(63) Continuation of application No. 17/279,197, filed as application No. PCT/JP2019/039776 on Oct. 9, 2019, now Pat. No. 11,842,949.

(30) Foreign Application Priority Data

Oct. 15, 2018 (JP) ................................. 2018-194255

(51) Int. Cl.
*H01L 23/495* (2006.01)
*H01L 25/16* (2023.01)

(52) U.S. Cl.
CPC .. *H01L 23/49524* (2013.01); *H01L 23/49562* (2013.01); *H01L 23/49575* (2013.01);
(Continued)

(58) Field of Classification Search
CPC ......... H01L 23/49524; H01L 23/49562; H01L 23/49575; H01L 23/49589; H01L 25/16;
(Continued)

(56) References Cited

U.S. PATENT DOCUMENTS 11,842,949 B2 * 12/2023 Yamaguchi ....... H01L 23/49562
2015/0171764 A1 6/2015 Ujita et al.

FOREIGN PATENT DOCUMENTS

| JP | 2006-156748 A | 6/2006 |
| JP | 2015-154591 A | 8/2015 |
| WO | 2014/033857 A1 | 3/2014 |

OTHER PUBLICATIONS

Office Action received in the corresponding Japanese Patent application, Nov. 8, 2022, and machine translation (8 pages).
(Continued)

*Primary Examiner* — Robert G Bachner
(74) *Attorney, Agent, or Firm* — HSML P.C.

(57) ABSTRACT

Semiconductor device A1 includes: first terminal 201A and second terminal 201B; first switching element 1A including first gate electrode 12A, first source electrode 13A and first drain electrode 14A; and second switching element 1B including second gate electrode 12B, second source electrode 13B and second drain electrode 14B. First switching element 1A and second switching element 1B are connected in series to each other between first terminal 201A and second terminal 201B. Semiconductor device A1 includes first capacitor 3A connected in parallel to first switching element 1A and second switching element 1B between first terminal 201A and second terminal 201B. First switching element 1A and second switching element 1B are aligned in y direction. First capacitor 3A overlaps with at least one of first switching element 1A and second switching element 1B as viewed in z direction. These arrangements serve to suppress surge voltage.

16 Claims, 9 Drawing Sheets

(52) U.S. Cl.
CPC ........ *H01L 23/49589* (2013.01); *H01L 25/16* (2013.01); *H01L 23/49513* (2013.01)

(58) Field of Classification Search
CPC ............. H01L 23/49513; H01L 25/072; H01L 23/49548; H01L 24/13; H01L 24/16; H01L 24/29; H01L 24/32; H01L 24/73; H01L 2224/0401; H01L 2224/0603; H01L 2224/13144; H01L 2224/16225; H01L 2224/29339; H01L 2224/32225; H01L 2224/32245; H01L 2224/73204; H01L 2224/83851; H01L 2924/1033; H01L 2924/13064; H01L 2924/19041; H01L 2924/19105; H01L 2224/16245; H01L 2924/181; H02M 3/003; H02M 7/003

See application file for complete search history.

(56) References Cited

OTHER PUBLICATIONS

Office Action received in the corresponding Chinese Patent application, May 25, 2023, and machine translation (11 pages).
Office Action received in the corresponding Chinese Patent application, Sep. 29, 2023, and machine translation (10 pages).
International Search Report issued in PCT/JP2019/039776, Dec. 17, 2019 (2 pages).

* cited by examiner

SEMICONDUCTOR DEVICE

TECHNICAL FIELD

The present disclosure relates to a semiconductor device.

BACKGROUND ART

Various semiconductor devices that include a high-voltage side switching element and a low-voltage side switching element are used. Patent Document 1 discloses an example of a conventional semiconductor device. In this semiconductor device, a high-voltage side switching element and a low-voltage side switching element are connected in series to each other between two input-side terminals.

PRIOR ART DOCUMENT

Patent Document

Patent Document 1: JP-A-2015-154591

SUMMARY OF THE INVENTION

Problem to be Solved by the Invention

When such a semiconductor device is used, it is common to connect a capacitor between the two input-side terminals. An inductance component of the connection path between this capacitor and the semiconductor device has a problem in which a surge voltage is generated the higher the switching speed is.

The present disclosure was conceived in view of the aforementioned circumstances, and it is an object thereof to provide a semiconductor device that can suppress a surge voltage.

Means for Solving the Problem

In accordance with the present disclosure, there is provided a semiconductor device comprises: a first terminal and a second terminal; a first switching element including a first gate electrode, a first source electrode, and a first drain electrode; and a second switching element including a second gate electrode, a second source electrode, and a second drain electrode. The first switching element and the second switching element are connected in series to each other between the first terminal and the second terminal. The semiconductor device includes a first capacitor connected in parallel to the first switching element and the second switching element between the first terminal and the second terminal. The first switching element and the second switching element are disposed in a first direction. The first capacitor overlaps with at least one of the first switching element and the second switching element as viewed in a second direction perpendicular to the first direction.

Advantages of the Invention

The present disclosure contributes to suppressing a surge voltage.

Other features and advantages of the present disclosure will be made clearer by the detailed description given below with reference to the accompanying drawings.

MODE FOR CARRYING OUT THE INVENTION

The following describes preferable embodiments of the present disclosure with reference to the drawings.

In the present disclosure, terms such as "first", "second", "third", etc., are used simply as labels, and are not necessarily intended to give an order to objects described with these terms.

FIGS. 1 to 14 show a semiconductor device according to a first embodiment of the present disclosure. A semiconductor device A1 of the present embodiment includes a first switching element 1A, a second switching element 1B, a plurality of leads 2, a first capacitor 3A, a second capacitor 3B, a third capacitor 3C, an integrated circuit element 4, and a resin portion 5.

Figure 1:
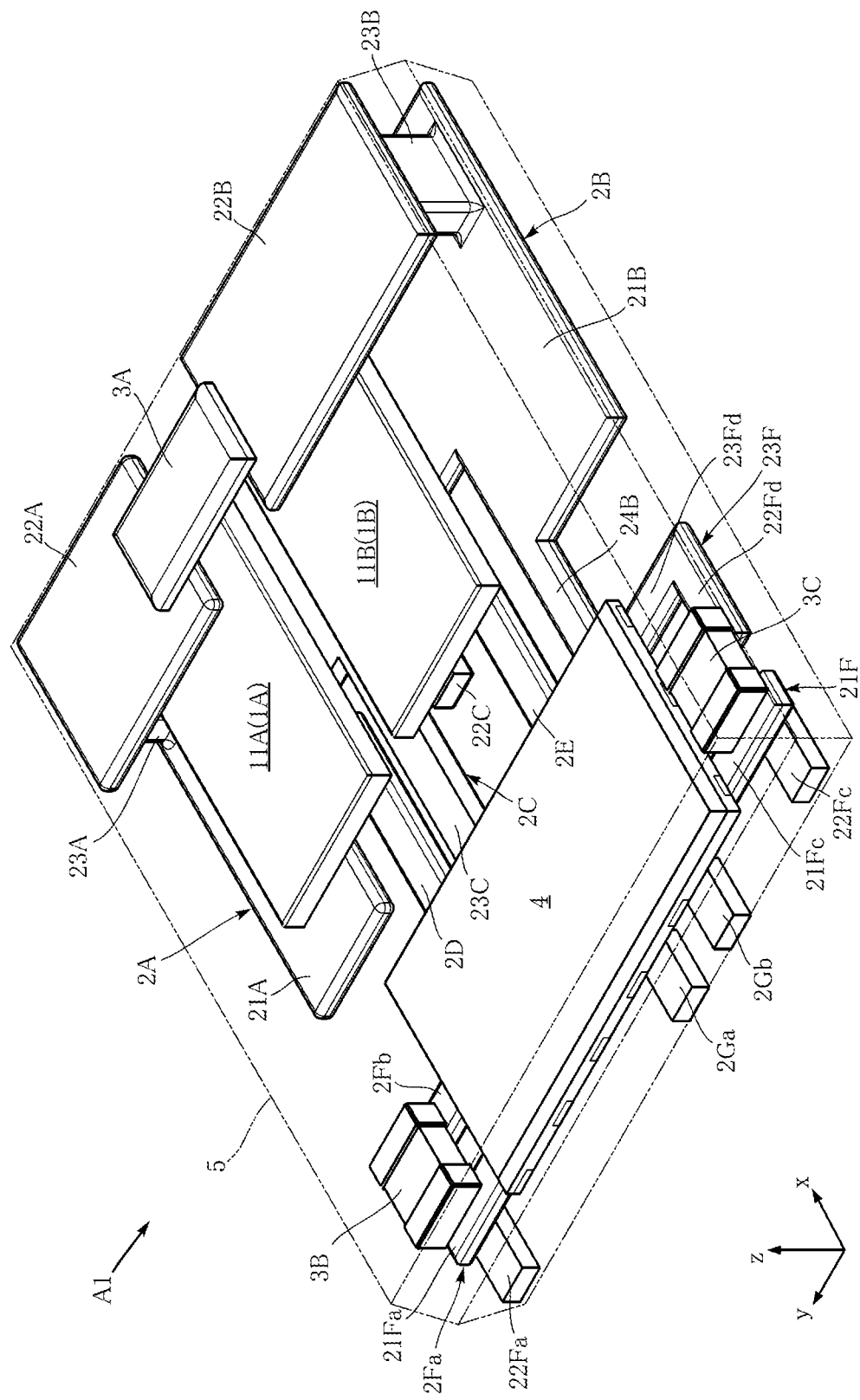
FIG. 1 is a perspective view illustrating a semiconductor device according to a first embodiment of the present disclosure.
Figure 2:
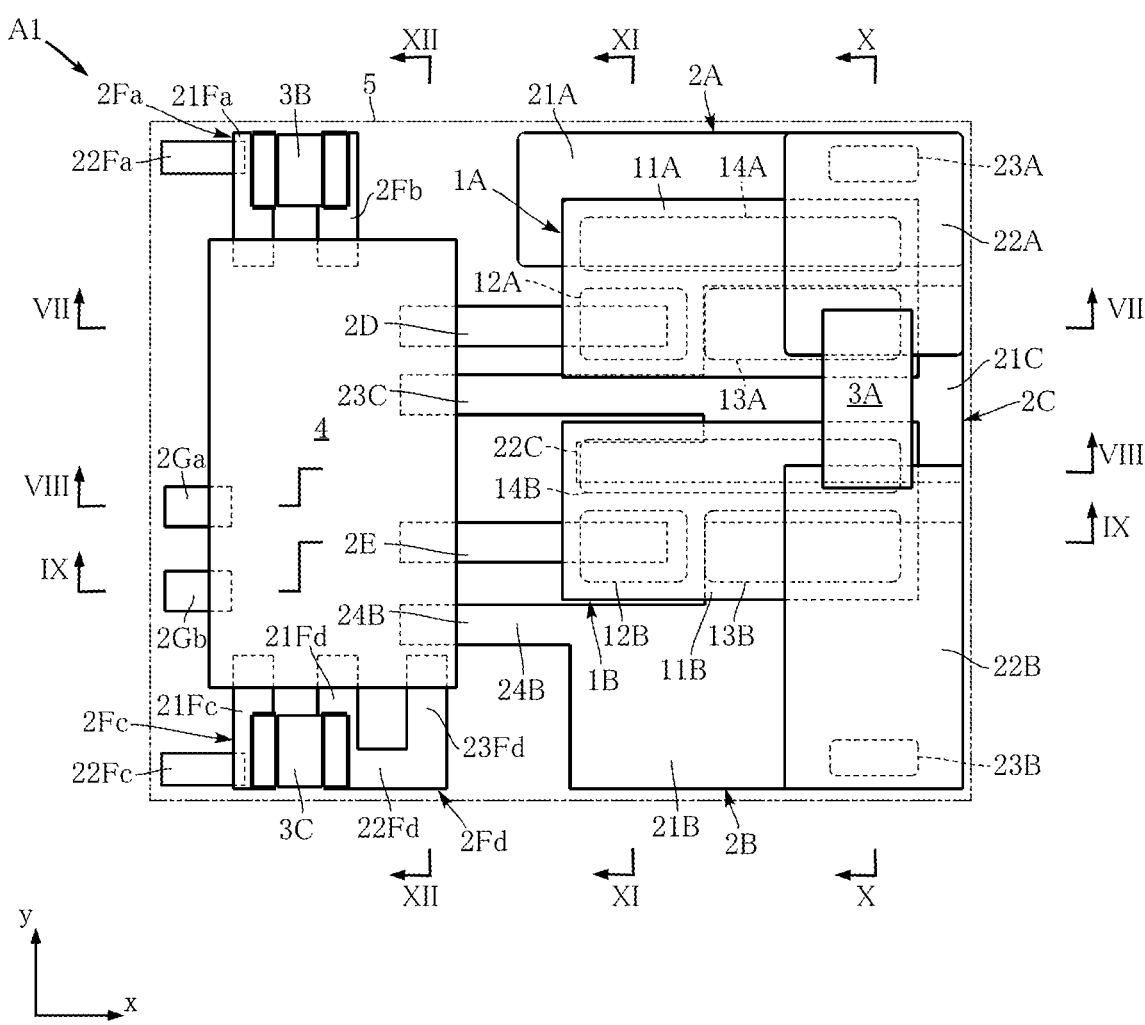
FIG. 2 is a plan view illustrating the semiconductor device according to the first embodiment of the present disclosure.
Figure 3:
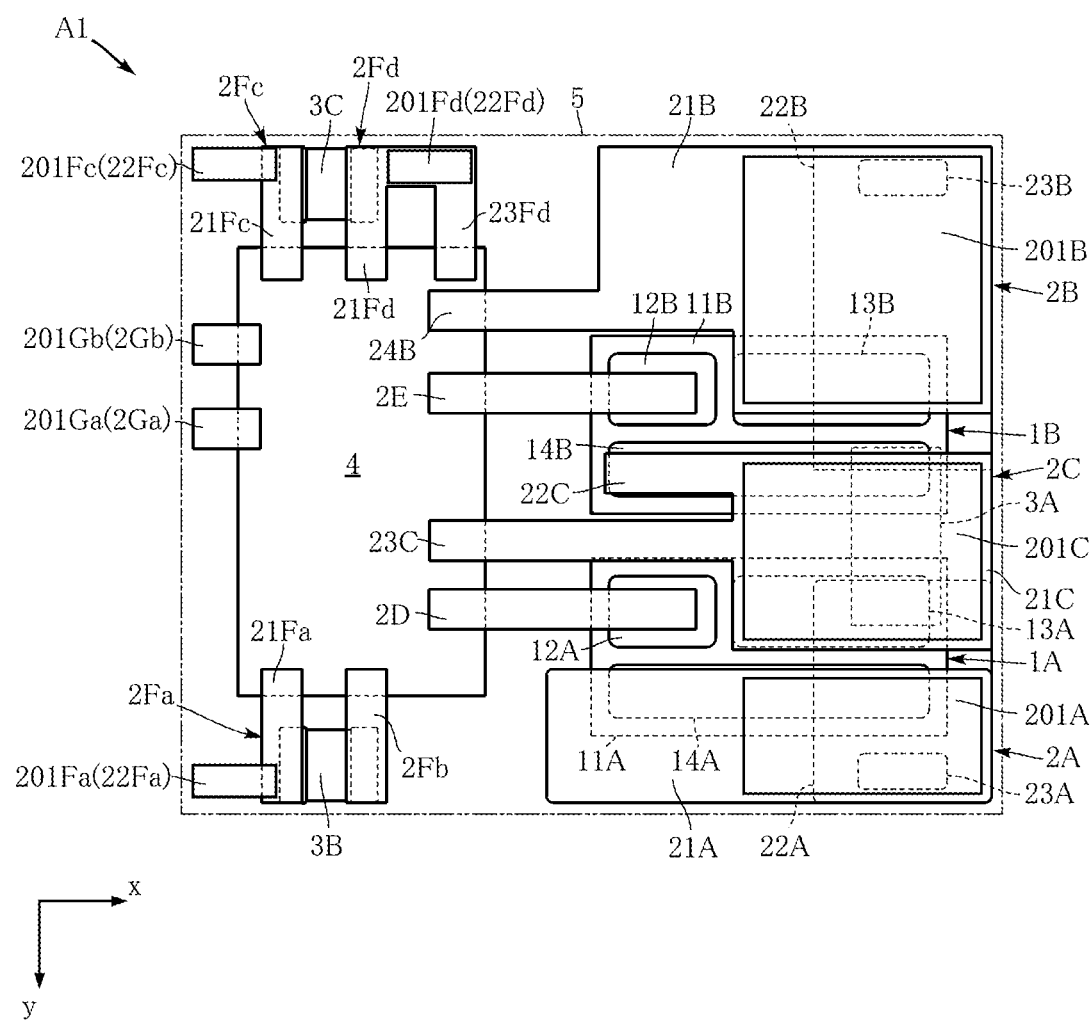
FIG. 3 is a bottom view illustrating the semiconductor device according to the first embodiment of the present disclosure.
Figure 4:
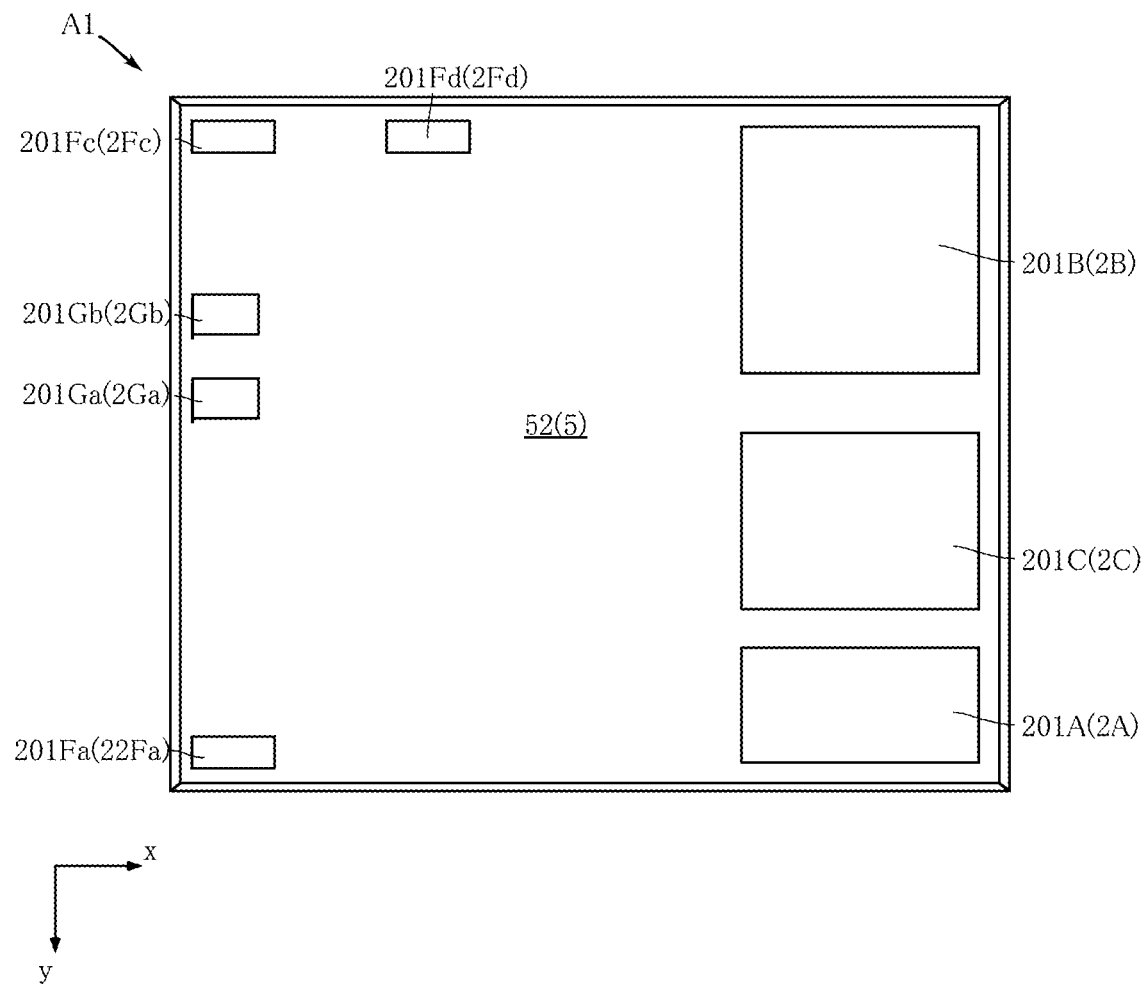
FIG. 4 is a bottom view illustrating the semiconductor device according to the first embodiment of the present disclosure.
Figure 5:
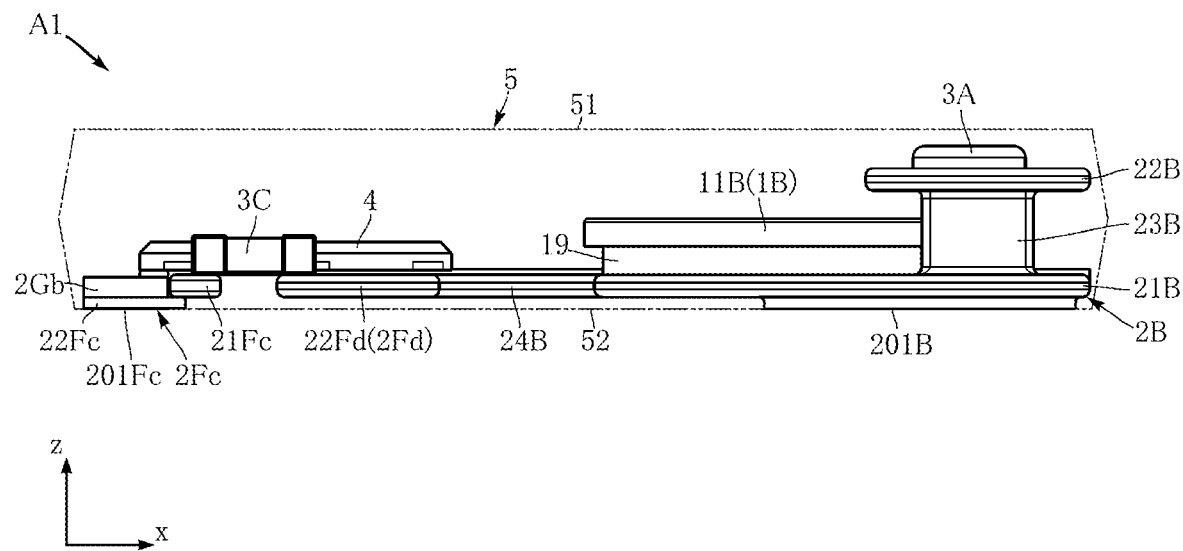
FIG. 5 is a front view illustrating the semiconductor device according to the first embodiment of the present disclosure.
Figure 6:
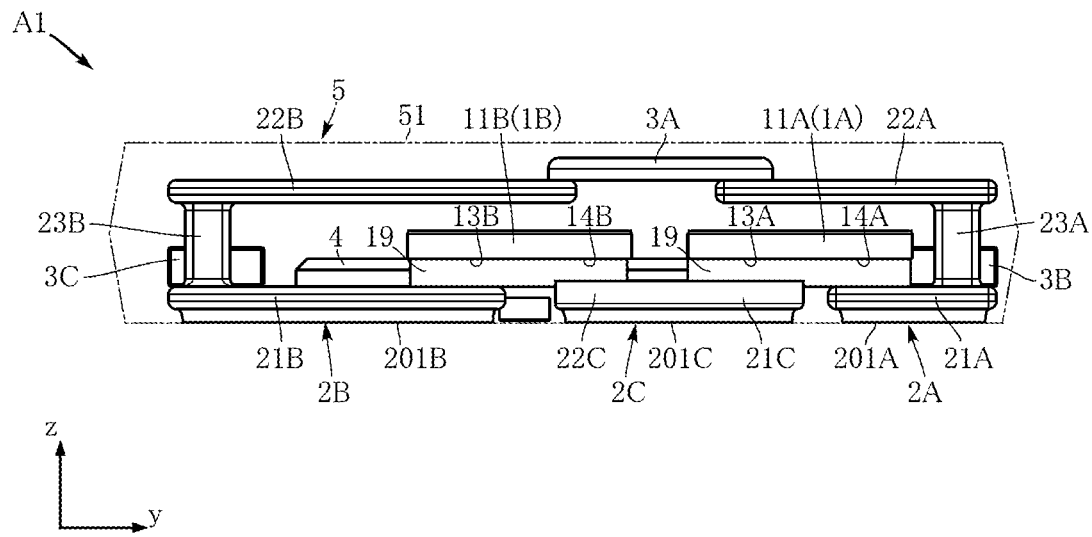
FIG. 6 is a side view illustrating the semiconductor device according to the first embodiment of the present disclosure.
Figure 7:
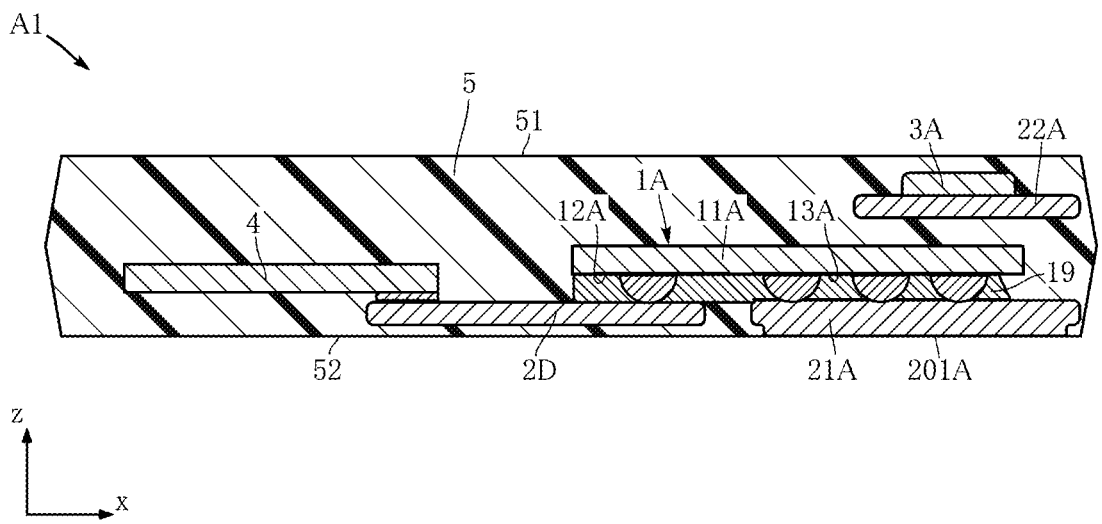
FIG. 7 is a cross-sectional view taken along a line VII-VII in FIG. 2.
Figure 8:
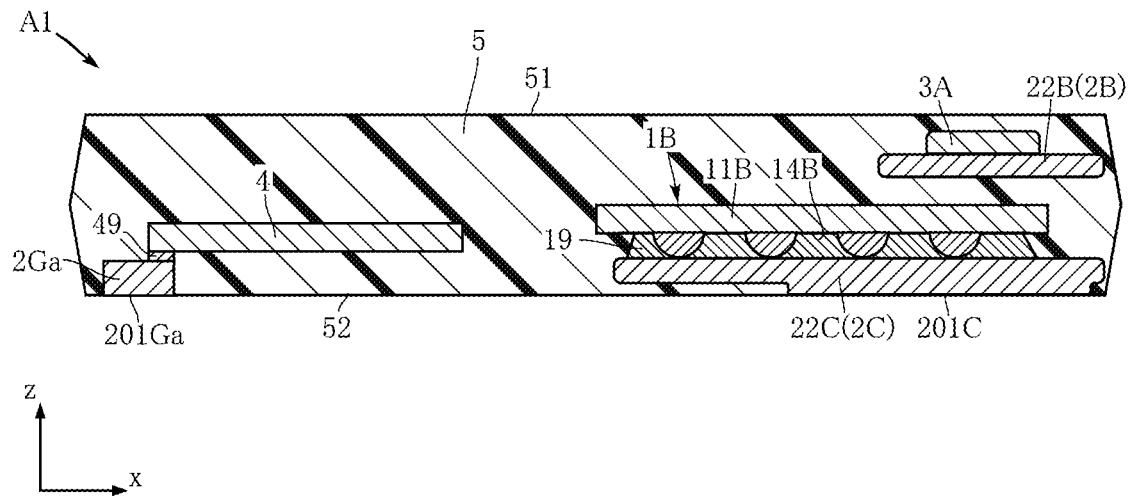
FIG. 8 is a cross-sectional view taken along a line VIII-VIII in FIG. 2.
Figure 9:
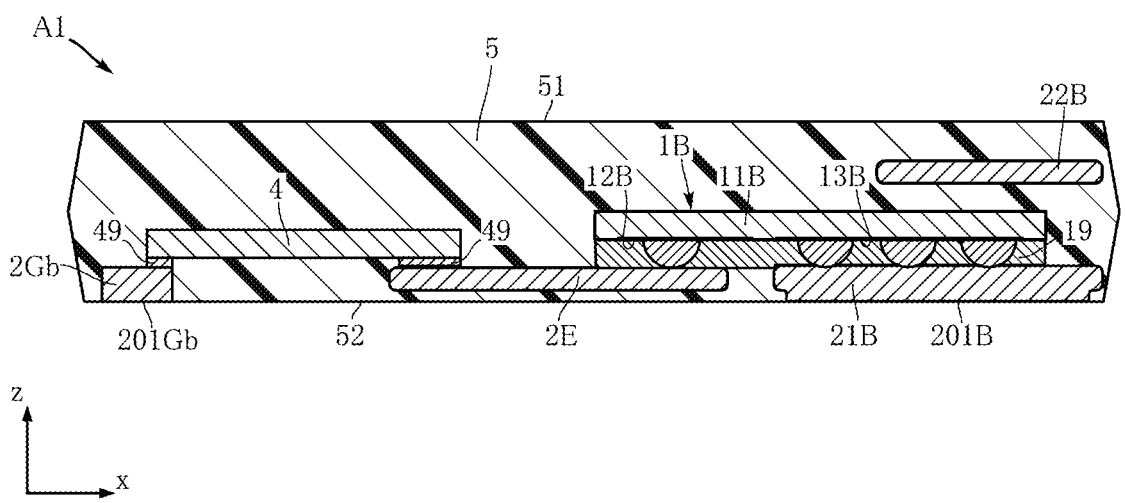
FIG. 9 is a cross-sectional view taken along a line IX-IX in FIG. 2.
Figure 10:
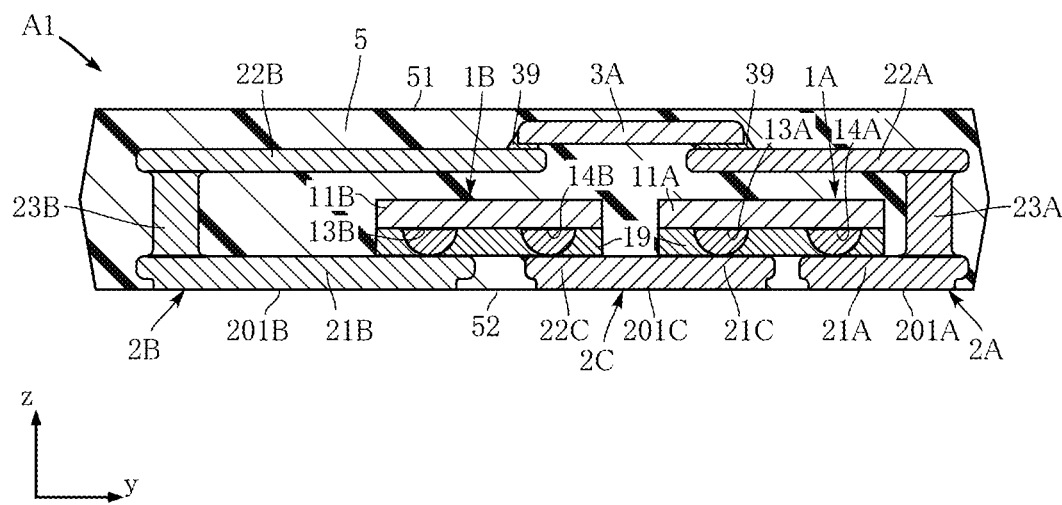
FIG. 10 is a cross-sectional view taken along a line X-X in FIG. 2.
Figure 11:
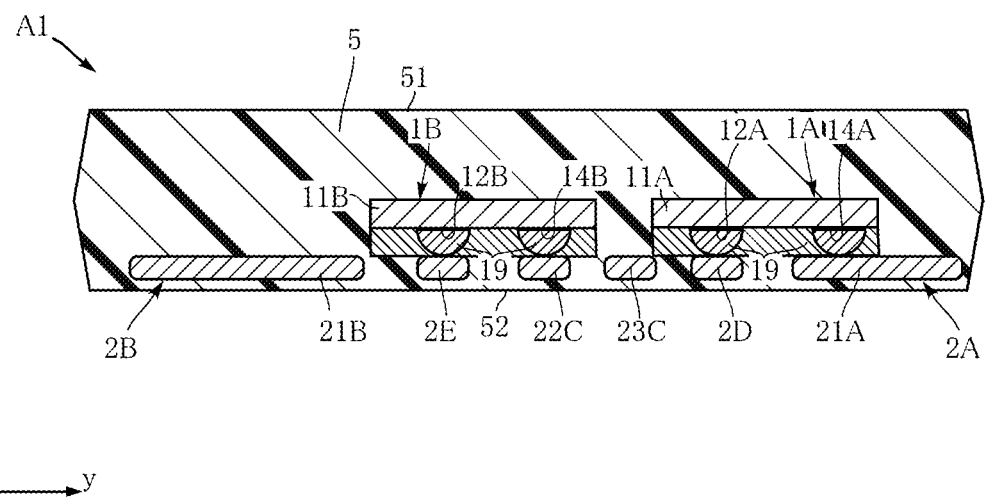
FIG. 11 is a cross-sectional view taken along a line XI-XI in FIG. 2.
Figure 12:
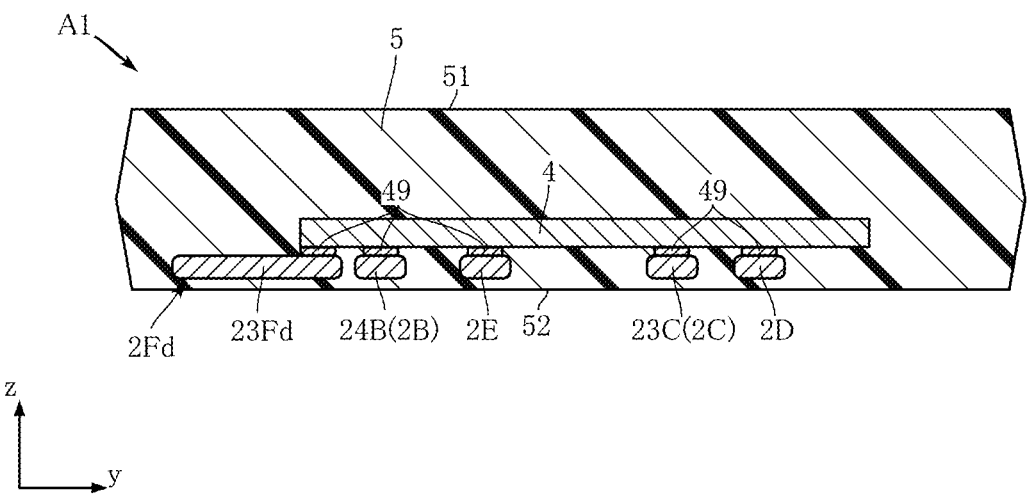
FIG. 12 is a cross-sectional view taken along a line XII-XII in FIG. 2.
Figure 13:
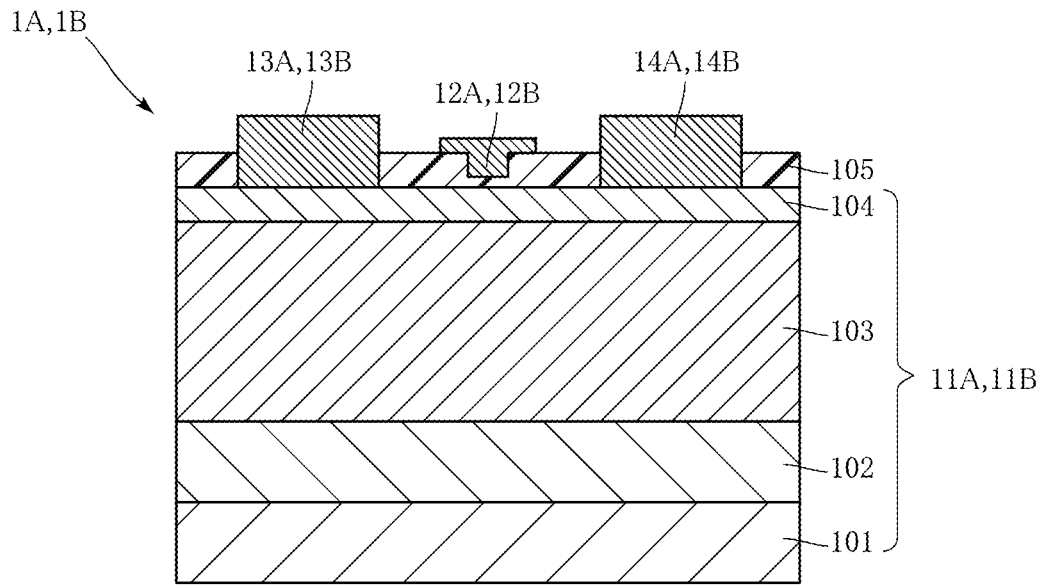
FIG. 13 is a cross-sectional view schematically illustrating an example of a switching element of the semiconductor device according to the first embodiment of the present disclosure.
Figure 14:
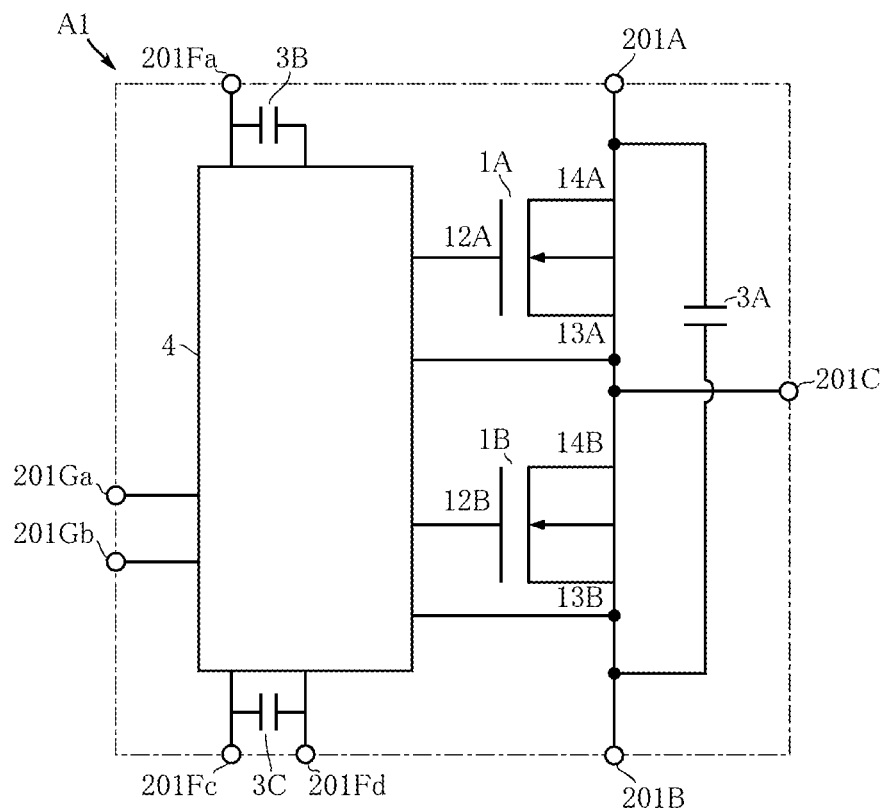
FIG. 14 is a circuit diagram illustrating the semiconductor device according to the first embodiment of the present disclosure.

FIG. 1 is a perspective view showing the semiconductor device A1. FIG. 2 is a plan view showing the semiconductor device A1. FIG. 3 is a bottom view showing the semiconductor device A1. FIG. 4 is a bottom view showing the semiconductor device A1. FIG. 5 is a front view showing the semiconductor device A1. FIG. 6 is a side view showing the semiconductor device A1. FIG. 7 is a cross-sectional view taken along a line VII-VII in FIG. 2. FIG. 8 is a cross-sectional view taken along a line VIII-VIII in FIG. 2. FIG. 9 is a cross-sectional view taken along a line IX-IX in FIG. 2. FIG. 10 is a cross-sectional view taken along a line X-X in FIG. 2. FIG. 11 is a cross-sectional view taken along a line XI-XI in FIG. 2. FIG. 12 is a cross-sectional view taken along a line XII-XII in FIG. 2. FIG. 13 is a cross-sectional view schematically showing an example of a switching element of the semiconductor device A1. FIG. 14 is a circuit diagram of the semiconductor device A1. In these drawings, a y direction corresponds to a first direction of the present disclosure. A z direction corresponds to a second direction of the present disclosure. An x direction corresponds to a third direction of the present disclosure.

The first switching element 1A is a high-voltage side switching element of the semiconductor device A1. The first switching element 1A of the present embodiment includes a first element body 11A, a first gate electrode 12A, a first source electrode 13A, and a first drain electrode 14A. The type of the first switching element 1A is not particularly limited. FIG. 13 schematically shows the first switching element 1A of the present example. The first element body 11A has a structure in which, for example, an Si substrate 101, a buffer layer 102, a GaN layer 103, and an AlGaN layer 104 are stacked on each other. An insulating layer 105 is stacked on the AlGaN layer 104, and the first gate electrode 12A, the first source electrode 13A, and the first drain electrode 14A are arranged on the insulating layer 105. Such a first switching element 1A is a so-called lateral power device in which the first gate electrode 12A, the first source electrode 13A, and the first drain electrode 14A are arranged on a surface of the first element body 11A. Also, the lateral power device in which the first element body 11A includes the GaN layer 103 may be referred to as a GaN-HEMT (High Electron Mobility Transistor). The first switching element 1A configured as a GaN-HEMT is suitable for increasing the speed of a current switching operation, that is, improving the rapid responsiveness.

As shown in FIG. 2, the first gate electrode 12A is arranged in a portion of the first element body 11A that is located on the other side (lower side of the drawing of FIG. 2) in the y direction and on one side (left side of the drawing of FIG. 2) in the x direction, as viewed in the z direction. The first source electrode 13A is arranged on the other side (right side of FIG. 2) of the first gate electrode 12A in the x direction, and overlaps with the first gate electrode 12A as viewed in the x direction. The first drain electrode 14A is arranged on one side (upper side of the drawing) of the first gate electrode 12A and the first source electrode 13A in the y direction, and overlaps with the first gate electrode 12A and the first source electrode 13A, as viewed in the y direction.

The second switching element 1B is a low-voltage side switching element of the semiconductor device A1. The second switching element 1B of the present embodiment includes a second element body 11B, a second gate electrode 12B, a second source electrode 13B, and a second drain electrode 14B. The type of the second switching element 1B is not particularly limited. FIG. 13 schematically shows the second switching element 1B of the present example, and has the same configuration as that of the first switching element 1A. Such a second switching element 1B is a so-called lateral power device in which the second gate electrode 12B, the second source electrode 13B, and the second drain electrode 14B are arranged on a surface of the second element body 11B. Also, the lateral power device in which the second element body 11B includes the GaN layer 103 may be referred to as a GaN-HEMT (High Electron Mobility Transistor). The second switching element 1B configured as a GaN-HEMT is suitable for increasing the speed of a current switching operation, that is, improving the rapid responsiveness.

As shown in FIG. 2, the second gate electrode 12B is arranged in a portion of the second element body 11B that is located on the other side (lower side of the drawing of FIG. 2) in the y direction and on one side (left side of the drawing of FIG. 2) in the x direction, as viewed in the z direction. The second source electrode 13B is arranged on the other side (right side of the drawing of FIG. 2) of the second gate electrode 12B in the x direction, and overlaps with the second gate electrode 12B as viewed in the x direction. The second drain electrode 14B is arranged on one side (upper side of the drawing) of the second gate electrode 12B and the second source electrode 13B in the y direction, and overlaps with the second gate electrode 12B and the second source electrode 13B, as viewed in the y direction.

The plurality of leads 2 support the first switching element 1A and the second switching element 1B, and constitute conduction paths to the first switching element 1A and the second switching element 1B. The plurality of leads 2 are made of any one of, e.g. Cu, Ni, and Fe, and an alloy thereof, for example. Also, the leads 2 may be provided with a plated layer at a predetermined position on a surface thereof. As shown in FIGS. 1 to 3, in the present embodiment, the plurality of leads 2 include a first lead 2A, a second lead 2B, a third lead 2C, a fourth lead 2D, a fifth lead 2E, a plurality of sixth leads 2F, and a plurality of seventh leads 2G.

The first lead 2A is an example of a first conductive member of the present disclosure. In the present embodiment, the first lead 2A includes a first portion 21A, a second portion 22A, and a third portion 23A. The first portion 21A, the second portion 22A, and the third portion 23A may be formed as one piece, or may be formed as separate members that are bonded to each other. FIG. 10 shows an example in which the first portion 21A, the second portion 22A, and the third portion 23A are formed as separate members that are bonded to each other.

As shown in FIG. 7, the first portion 21A is a region that is conductively bonded to the first drain electrode 14A of the first switching element 1A. In the shown example, the first portion 21A is conductively bonded to the first drain electrode 14A by a conductive bonding material 19. In the shown example, the first drain electrode 14A has bumps made of Au or the like. The conductive bonding material 19 is, for example, an anisotropic conductive bonding material, and brings the bumps and the first portion 21A into conduction. Note that a form of conductive bonding without using bumps may also be employed. In that case, the conductive bonding material 19 may be an Ag paste or the like. The first portion 21A is opposed to the first drain electrode 14A, and is located on one side (lower side of the drawing) of the first drain electrode 14A in the z direction. The shape of the first portion 21A is not particularly limited, and in the shown example, the first portion 21A is rectangular as viewed in the z direction as shown in FIG. 3.

A part of the first portion 21A is exposed from a second surface 52 of the resin portion 5. The exposed region constitutes a first terminal 201A. The first terminal 201A is a terminal to which a current controlled by the semiconductor device A1 is input, and is referred to as a VDD terminal, for example. In the shown example, the first terminal 201A is constituted by a surface of a region of the first portion 21A that is thicker than its peripheral region. Such a first portion 21A can be formed through, for example, etching. The shape of the first terminal 201A is not particularly limited, and in the shown example, the first terminal 201A is rectangular as shown in FIGS. 3 and 4. Note that the specific structure that constitutes the first terminal 201A is not limited to the structure in which a part of the first portion 21A is thick. An example of another structure that constitutes the first terminal 201A is a structure in which, for example, a part of the first portion 21A is bent so that a region constituting the first terminal 201A is located on one side (lower side of the drawing of FIG. 7) of the remaining region in the z direction.

The second portion 22A is arranged on the other side (upper side) of the first switching element LA in the z direction in FIGS. 6 and 7 that is opposite to the first portion 21A in the z direction. The second portion 22A is conductively bonded to the first capacitor 3A. In the shown example, the second portion 22A is conductively bonded to the first capacitor 3A by a conductive bonding material 39. The conductive bonding material 39 is solder, for example. The second portion 22A overlaps with the first portion 21A as viewed in the z direction. The second portion 22A overlaps with the first source electrode 13A and the first drain electrode 14A of the first switching element LA as viewed in the z direction. The shape of the second portion 22A is not particularly limited, and in the shown example, the second portion 22A is rectangular as shown in FIG. 2. In the shown example, the size of the second portion 22A in the x direction is smaller than the size of the first portion 21A in the x direction. Also, the size of the second portion 22A in the y direction is larger than the size of the first portion 21A in the y direction.

As shown in FIGS. 6 and 10, the third portion 23A is arranged on the side of the first switching element LA in the y direction that is opposite to the second switching element 1B. The third portion 23A is arranged between the first portion 21A and the second portion 22A in the z direction, and couples the first portion 21A to the second portion 22A. As shown in FIGS. 2 and 3, the entire third portion 23A overlaps with the first portion 21A and the second portion 22A as viewed in the z direction.

The second lead 2B is an example of a second conductive member of the present disclosure. In the present embodiment, the second lead 2B includes a first portion 21B, a second portion 22B, a third portion 23B, and a fourth portion 24B. The first portion 21B, the second portion 22B, the third portion 23B, and the fourth portion 24B may be formed as one piece, or may be formed as separate members that are bonded to each other. FIG. 10 shows an example in which the first portion 21B, the second portion 22B, and the third portion 23B are formed as separate members that are bonded to each other. Also, in the shown example, the first portion 21B and the fourth portion 24B are formed as one piece.

As shown in FIG. 9, the first portion 21B is a region that is conductively bonded to the second source electrode 13B of the second switching element 1B. In the shown example, the first portion 21B is conductively bonded to the second source electrode 13B by the conductive bonding material 19. In the shown example, the second source electrode 13B has bumps made of Au or the like. The conductive bonding material 19 is, for example, an anisotropic conductive bonding material, and brings the bumps and the first portion 21B into conduction. Note that a form of conductive bonding without using bumps may also be employed. In that case, the conductive bonding material 19 may be an Ag paste or the like. The first portion 21B is opposed to the second source electrode 13B, and is located on one side (lower side of the drawing) of the second source electrode 13B in the z direction. The shape of the first portion 21B is not particularly limited, and in the shown example, as shown in FIG. 3, the first portion 21B has a shape that includes a substantially rectangular portion that overlaps with the second source electrode 13B as viewed in the z direction, and a substantially rectangular portion that protrudes from the second switching element 1B in the y direction as viewed in the z direction.

A part of the first portion 21B is exposed from the second surface 52 of the resin portion 5. The exposed region constitutes a second terminal 201B. The second terminal 201B is, for example, a ground terminal that corresponds to the VDD terminal. In the shown example, the second terminal 201B is constituted by a surface of a region of the first portion 21B that is thicker than its peripheral region. Such a first portion 21B can be formed through, for example, etching. The shape of the second terminal 201B is not particularly limited, and in the shown example, the second terminal 201B is rectangular as shown in FIGS. 3 and 4. Note that the specific structure that constitutes the second terminal 201B is not limited to the structure in which a part of the first portion 21A is thick. An example of another structure that constitutes the second terminal 201B is a structure in which, for example, a part of the first portion 21B is bent so that a region constituting the second terminal 201B is located on one side (lower side of the drawing of FIG. 10) of the remaining region in the z direction.

The second portion 22B is arranged on the other side (upper side) of the second switching element 1B in the z direction in FIG. 6 that is opposite to the first portion 21B in the z direction. The second portion 22B is conductively bonded to the first capacitor 3A. In the shown example, the second portion 22B is conductively bonded to the first capacitor 3A by the conductive bonding material 39. The second portion 22B overlaps with the first portion 21B as viewed in the z direction. The second portion 22B overlaps with the first source electrode 13A and the first drain electrode 14A of the second switching element 1B as viewed in the z direction. The shape of the second portion 22B is not particularly limited, and in the shown example, the second portion 22B is rectangular as shown in FIG. 2. In the shown example, the size of the second portion 22B in the x direction is smaller than the size of the first portion 21B in the x direction. Also, the size of the second portion 22B in the y direction is larger than the size of the second portion 22A in the y direction.

As shown in FIGS. 6 and 10, the third portion 23B is arranged on the side of the second switching element 1B in the y direction that is opposite to the first switching element LA. The third portion 23B is arranged between the first portion 21B and the second portion 22B in the z direction, and couples the first portion 21B to the second portion 22B. As shown in FIGS. 2 and 3, the entire third portion 23B overlaps with the first portion 21B and the second portion 22B as viewed in the z direction.

The fourth portion 24B extends from the first portion 21B to one side in the x direction (to the left of the drawing of FIG. 2). The shape of the fourth portion 24B is not particularly limited, and in the shown example, the fourth portion 24B has the shape of an elongated rectangle whose longitudinal direction corresponds to the x direction. The fourth portion 24B is conductively bonded to the integrated circuit element 4. As shown in FIG. 12, in the shown example, the fourth portion 24B is conductively bonded to the integrated circuit element 4 by a conductive bonding material 49. The conductive bonding material 49 is solder, for example.

The third lead 2C is an example of a third conductive member of the present disclosure. The third lead 2C of the present embodiment includes a first portion 21C, a second portion 22C, and a third portion 23C. The third lead 2C is arranged between the first portion 21A of the first lead 2A and the first portion 21B of the second lead 2B in the y direction.

The first portion 21C is a region that is conductively bonded to the first source electrode 13A of the first switching element 1A. As shown in FIG. 10, the first portion 21C is conductively bonded to the first source electrode 13A by, for example, the conductive bonding material 19. In the shown example, the first source electrode 13A has bumps made of Au or the like. The conductive bonding material 19 is, for example, an anisotropic conductive bonding material, and brings the bumps and the first portion 21C into conduction. Note that a form of conductive bonding without using bumps may also be employed. In that case, the conductive bonding material 19 may be an Ag paste or the like. The shape of the first portion 21C is not particularly limited, and in the shown example, the first portion 21C is rectangular as viewed in the z direction. The first portion 21C overlaps with the first source electrode 13A as viewed in the z direction.

The second portion 22C is a region that is conductively bonded to the second drain electrode 14B of the second switching element 1B. As shown in FIG. 10, the second portion 22C is conductively bonded to the second drain electrode 14B by, for example, the conductive bonding material 19. In the shown example, the second drain electrode 14B has bumps made of Au or the like. The conductive bonding material 19 is, for example, an anisotropic conductive bonding material, and brings the bumps and the second portion 22C into conduction. Note that a form of conductive bonding without using bumps may also be employed. In that case, the conductive bonding material 19 may be an Ag paste or the like. The shape of the second portion 22C is not particularly limited, and in the shown example, the second portion 22C has the shape of an elongated rectangle extending in the x direction as viewed in the z direction. The size of the second portion 22C in the x direction is larger than the size of the first portion 21C in the x direction.

The third portion 23C extends from the first portion 21C to one side in the x direction (to the left of the drawings of FIGS. 2 and 3). The third portion 23C is conductively bonded to the integrated circuit element 4. In the shown example, the third portion 23C is conductively bonded to the integrated circuit element 4 by the conductive bonding material 49. The shape of the third portion 23C is not particularly limited, and in the shown example, the third portion 23C has the shape of an elongated rectangle whose longitudinal direction corresponds to the x direction.

Parts of the first portion 21C and the second portion 22C are exposed from the second surface 52 of the resin portion 5. The exposed regions constitute a third terminal 201C. The third terminal 201C is an output terminal of the semiconductor device A1. In the shown example, the third terminal 201C is constituted by surfaces of regions of the first portion 21C and the second portion 22C that are thicker than their peripheral regions. These first portion 21C and second portion 22C can be formed through, for example, etching. The shape of the third terminal 201C is not particularly limited, and in the shown example, the third terminal 201C is rectangular as shown in FIGS. 3 and 4. Also, the third terminal 201C is arranged between the first terminal 201A and the second terminal 201B in the y direction. Note that the specific structure that constitutes the third terminal 201C is not limited to the structure in which parts of the first portion 21C and the second portion 22C are thick. An example of another structure that constitutes the third terminal 201C is a structure in which, for example, parts of the first portion 21C and the second portion 22C are bent so that regions constituting the third terminal 201C are located on one side (lower side of the drawing of FIG. 10) of the remaining regions in the z direction.

The fourth lead 2D is an example of a fourth conductive member of the present disclosure. As shown in FIG. 11, the fourth lead 2D is conductively bonded to the first gate electrode 12A of the first switching element 1A. In the shown example, the fourth lead 2D is conductively bonded to the first gate electrode 12A by the conductive bonding material 19. In the shown example, the first gate electrode 12A has bumps made of Au or the like. The conductive bonding material 19 is, for example, an anisotropic conductive bonding material, and brings the bumps and the fourth lead 2D into conduction. Note that a form of conductive bonding without using bumps may also be employed. In that case, the conductive bonding material 19 may be an Ag paste or the like. Also, as shown in FIG. 12, the fourth lead 2D is conductively bonded to the integrated circuit element 4. In the shown example, the fourth lead 2D is conductively bonded to the integrated circuit element 4 by the conductive bonding material 49. The shape of the fourth lead 2D is not particularly limited, and in the shown example, the fourth lead 2D has the shape of an elongated rectangle whose longitudinal direction corresponds to the x direction as shown in FIGS. 2 and 3. In the shown example, the fourth lead 2D is arranged between the first portion 21A of the first lead 2A and the third portion 23C of the third lead 2C in the y direction. The entire surface of the fourth lead 2D that is located opposite to the first gate electrode 12A in the z direction is covered by the resin portion 5.

The fifth lead 2E is an example of a fifth conductive member of the present disclosure. As shown in FIG. 11, the fifth lead 2E is conductively bonded to the second gate electrode 12B of the second switching element 1B. In the shown example, the fifth lead 2E is conductively bonded to the first gate electrode 12A by the conductive bonding material 19. In the shown example, the second gate electrode 12B has bumps made of Au or the like. The conductive bonding material 19 is, for example, an anisotropic conductive bonding material, and brings the bumps and the fifth lead 2E into conduction. Note that a form of conductive bonding without using bumps may also be employed. In that case, the conductive bonding material 19 may be an Ag paste or the like. Also, as shown in FIG. 12, the fifth lead 2E is conductively bonded to the integrated circuit element 4. In the shown example, the fifth lead 2E is conductively bonded to the integrated circuit element 4 by the conductive bonding material 49. The shape of the fifth lead 2E is not particularly limited, and in the shown example, the fifth lead 2E has the shape of an elongated rectangle whose longitudinal direction corresponds to the x direction as shown in FIGS. 2 and 3. In the shown example, the fifth lead 2E is arranged between the first portion 21B of the second lead 2B and the second portion 22C of the third lead 2C in the y direction.

The plurality of sixth leads 2F are connected to the integrated circuit element 4, and the second capacitor 3B and the third capacitor 3C. In the present embodiment, the plurality of sixth leads 2F include sixth leads 2Fa, 2Fb, 2Fc, and 2Fd.

As shown in FIG. 2, the sixth lead 2Fa includes a first portion 21Fa and a second portion 22Fa. The first portion 21Fa is conductively bonded to a portion of the integrated circuit element 4 on one side in the y direction by, for example, the conductive bonding material 49. Also, the first portion 21Fa is conductively bonded to the second capacitor 3B with the conductive bonding material 39. The shape of the first portion 21Fa is not particularly limited, and in the shown example, the first portion 21Fa has the shape of an elongated rectangle whose longitudinal direction corresponds to the y direction.

The second portion 22Fa may be configured by a separate member conductively bonded to the first portion 21Fa, or may be formed together with the first portion 21Fa as one piece. The second portion 22Fa is arranged on one side of the first portion 21Fa in the z direction. Also, the second portion 22Fa extends to one side of the first portion 21Fa in the x direction. The shape of the second portion 22Fa is not particularly limited, and in the shown example, the second portion 22Fa has the shape of an elongated rectangle whose longitudinal direction corresponds to the x direction.

As shown in FIGS. 3 and 4, a part of the second portion 22Fa is exposed from the second surface 52 of the resin portion 5. The exposed region constitutes a terminal 201Fa. The terminal 201Fa is a terminal for constituting a bootstrap circuit that includes the second capacitor 3B, for example. In the shown example, the terminal 201Fa is the surface of the second portion 22Fa that faces one side in the z direction.

The sixth lead 2Fb is conductively bonded to a portion of the integrated circuit element 4 on one side in the y direction by, for example, the conductive bonding material 49. Also, the sixth lead 2Fb is conductively bonded to the second capacitor 3B by the conductive bonding material 39. The shape of the sixth lead 2Fb is not particularly limited, and in the shown example, the sixth lead 2Fb has the shape of an elongated rectangle whose longitudinal direction corresponds to the y direction. Also, the entire surface of the sixth lead 2Fb that is located opposite to the second capacitor 3B in the z direction is covered by the resin portion 5.

As shown in FIG. 2, the sixth lead 2Fc includes a first portion 21Fc and a second portion 22Fc. The first portion 21Fc is conductively bonded to a portion of the integrated circuit element 4 on the other side in the y direction by, for example, the conductive bonding material 49. Also, the first portion 21Fc is conductively bonded to the third capacitor 3C by the conductive bonding material 39. The shape of the first portion 21Fc is not particularly limited, and in the shown example, the first portion 21Fc has the shape of an elongated rectangle whose longitudinal direction corresponds to the y direction.

The second portion 22Fc may be configured by a separate member conductively bonded to the first portion 21Fc, or may be formed together with the first portion 21Fc as one piece. The second portion 22Fc is arranged on one side of the first portion 21Fc in the z direction. Also, the second portion 22Fc extends to one side of the first portion 21Fc in the x direction. The shape of the second portion 22Fc is not particularly limited, and in the shown example, the second portion 22Fc has the shape of an elongated rectangle whose longitudinal direction corresponds to the x direction.

As shown in FIGS. 3 and 4, a part of the second portion 22Fc is exposed from the second surface 52 of the resin portion 5. The exposed region constitutes a terminal 201Fc. The terminal 201Fc is an input terminal to which a drive current for the integrated circuit element 4 is input, for example. In the shown example, the terminal 201Fc is the surface of the second portion 22Fc that faces one side in the z direction.

As shown in FIG. 2, the sixth lead 2Fd includes a first portion 21Fd, a second portion 22Fd, and a third portion 23Fd. The first portion 21Fd is conductively bonded, while being aligned with the first portion 21Fc, to a portion of the integrated circuit element 4 on the other side in the y direction by, for example, the conductive bonding material 49. Also, the first portion 21Fd is conductively bonded to the third capacitor 3C by the conductive bonding material 39. The shape of the first portion 21Fd is not particularly limited, and in the shown example, the first portion 21Fd has the shape of an elongated rectangle whose longitudinal direction corresponds to the y direction.

The second portion 22Fd may be configured by a separate member conductively bonded to the first portion 21Fd, or may be formed together with the first portion 21Fd as one piece. The second portion 22Fd extends to the other side of the first portion 21Fd in the x direction. The shape of the second portion 22Fd is not particularly limited, and in the shown example, the second portion 22Fd has the shape of an elongated rectangle whose longitudinal direction corresponds to the x direction.

As shown in FIGS. 3 and 4, a part of the second portion 22Fd is exposed from the second surface 52 of the resin portion 5. The exposed region constitutes a terminal 201Fd. The terminal 201Fd is, for example, a ground terminal that corresponds to the input terminal to which a drive current for the integrated circuit element 4 is input. In the shown example, the terminal 201Fd is constituted by a surface of a region of the second portion 22Fd that is thicker than its peripheral region. Such a second portion 22Fd can be formed through, for example, etching. The shape of the terminal 201Fd is not particularly limited, and in the shown example, the terminal 201Fd has the shape of an elongated rectangle whose longitudinal direction corresponds to the y direction, as shown in FIGS. 3 and 4. Note that the specific structure that constitutes the terminal 201Fd is not limited to the structure in which a part of the second portion 22Fd is thick. An example of another structure that constitutes the terminal 201Fd is a structure in which, for example, a part of the second portion 22Fd is bent so that a region constituting the terminal 201Fd is located on one side (lower side of the drawing of FIG. 10) of the remaining region in the z direction.

The third portion 23Fd is conductively bonded, together with the first portion 21Fd, to a portion of the integrated circuit element 4 on the other side in the y direction by, for example, the conductive bonding material 49. Also, the third portion 23Fd extends in the y direction from the other end of the second portion 22Fd in the x direction. The shape of the third portion 23Fd is not particularly limited, and in the shown example, the third portion 23Fd has the shape of an elongated rectangle whose longitudinal direction corresponds to the y direction.

The plurality of seventh leads 2G are connected to the integrated circuit element 4. In the present embodiment, the plurality of seventh leads 2G include seventh leads 2Ga and 2Gb.

The seventh lead 2Ga is conductively bonded to a portion of the integrated circuit element 4 that is located on one side (left side of the drawing of FIG. 8) in the x direction and on one side (lower side of the drawing of FIG. 8) in the z direction. The shape of the seventh lead 2Ga is not particularly limited, and in the shown example, the seventh lead 2Ga has the shape of an elongated rectangle whose longitudinal direction corresponds to the x direction, as shown in FIGS. 2 and 3. Also, the surface of the seventh lead 2Ga that faces one side (lower side of the drawing of FIG. 8) in the z direction is exposed from the second surface 52 of the resin portion 5, and constitutes a terminal 201Ga. The terminal 201Ga is, for example, a control terminal of the integrated circuit element 4.

The seventh lead 2Gb is conductively bonded, while being aligned with the seventh lead 2Ga, to a portion of the integrated circuit element 4 on one side (left side of the drawing of FIG. 8) in the x direction, and on one side (lower side of the drawing of FIG. 8) in the z direction. The shape of the seventh lead 2Gb is not particularly limited, and in the shown example, the seventh lead 2Gb has the shape of an elongated rectangle whose longitudinal direction corresponds to the x direction, as shown in FIGS. 2 and 3. Also, a surface of the seventh lead 2Gb that faces one side in the z direction (lower side of the drawing of FIG. 8) is exposed from the second surface 52 of the resin portion 5, and constitutes a terminal 201Gb. The terminal 201Gb is, for example, a control terminal of the integrated circuit element 4.

The first capacitor 3A is connected in parallel to the first switching element LA and the second switching element 1B between the first terminal 201A and the second terminal 201B. The first capacitor 3A is configured to suppress fluctuation of a current input to the first switching element LA and the second switching element 1B, and prevent noise.

As shown in FIG. 2, the first capacitor 3A overlaps with at least one of the first switching element LA and the second switching element 1B as viewed in the z direction, and in the shown example, the first capacitor 3A overlaps with both the first switching element LA and the second switching element 1B. Specifically, in the present example, the first capacitor 3A overlaps with the first source electrode 13A of the first switching element LA and the second drain electrode 14B of the second switching element 1B, as viewed in the z direction. The first capacitor 3A is conductively bonded to the second portion 22A of the first lead 2A and the second portion 22B of the second lead 2B by the conductive bonding material 39.

The integrated circuit element 4 is arranged on one side (left side of the drawing of FIG. 2) of the first switching element LA and the second switching element 1B in the x direction. In the present embodiment, the integrated circuit element 4 is conductive to the first gate electrode 12A via the fourth lead 2D, and is conductive to the second gate electrode 12B via the fifth lead 2E, and the integrated circuit element 4 is a gate driver IC of the first switching element 1A and the second switching element 1B. Note that the integrated circuit element 4 may have a configuration in which a gate driver IC of the first switching element 1A and a gate driver IC of the second switching element 1B are provided separately. The second capacitor 3B is connected to the integrated circuit element 4 via the sixth lead 2Fa and the sixth lead 2Fb. Also, the third capacitor 3C is connected to the integrated circuit element 4 via the sixth lead 2Fc and the sixth lead 2Fd.

As shown in FIG. 2, the second capacitor 3B is conductively bonded to the first portion 21Fa of the sixth lead 2Fa, and the sixth lead 2Fb. The second capacitor 3B is used to configure, for example, a bootstrap circuit for boosting a gate voltage. In the shown example, the second capacitor 3B is arranged on one side (upper side of the drawing of FIG. 2) of the integrated circuit element 4 in the y direction.

As shown in FIG. 2, the third capacitor 3C is conductively bonded to the first portion 21Fc of the sixth lead 2Fc and the first portion 21Fd of the sixth lead 2Fd. The third capacitor 3C is configured to suppress fluctuation of a current input to the integrated circuit element 4, and prevent noise, for example.

The resin portion 5 covers the entirety of the first switching element LA, the second switching element 1B, the first capacitor 3A, the second capacitor 3B, the third capacitor 3C, and the integrated circuit element 4. Also, the resin portion 5 covers the entirety or a part of each of the plurality of leads 2. The resin portion 5 is made of, for example, a black epoxy resin mixed with a filler. The resin portion 5 has a first surface 51 and a second surface 52. The first surface 51 is a surface that faces the other side (upper side of the drawing of FIG. 7) in the z direction. The second surface 52 is a surface that faces one side (lower side of the drawing of FIG. 7) in the z direction. As shown in FIG. 4, the first terminal 201A, the second terminal 201B, the third terminal 201C, the terminal 201Fa, the terminal 201Fc, the terminal 201Fd, the terminal 201Ga, and the terminal 201Gb are exposed from the second surface 52. Note that the present invention may be configured without any of the terminal 201Fa, the terminal 201Fc, the terminal 201Fd, the terminal 201Ga, and the terminal 201Gb, or with an additional terminal of the same type as any of them.

FIG. 14 is a circuit diagram showing the semiconductor device A1. As described above, the high-voltage side first switching element LA and the low-voltage side second switching element 1B are connected in series to each other between the first terminal 201A and the second terminal 201B, which serve as input terminals. The third terminal 201C, which serves as an output terminal, is connected to the first source electrode 13A of the first switching element LA and the second drain electrode 14B of the second switching element 1B. The integrated circuit element 4 is connected to the first gate electrode 12A and the second gate electrode 12B. The third capacitor 3C is connected to the terminal 201Fd and the terminal 201Fc, which are the input terminals of the integrated circuit element 4. Note that the terminal 201Fd, which is a ground terminal, is not common with the second terminal 201B, which is a ground terminal, and is provided separately. The second capacitor 3B is connected to the terminal 201Fa to constitute a bootstrap circuit, for example. The terminal 201Ga and the terminal 201Gb are, for example, control signal terminals of the integrated circuit element 4.

The following will describe effects of the semiconductor device A1.

According to the present embodiment, the first capacitor 3A overlaps with at least one of the first switching element 1A and the second switching element 1B as viewed in the z direction. Accordingly, it is possible to prevent conduction paths between the first switching element 1A and the second switching element 1B, and the first capacitor 3A from becoming a bypass path as viewed in the z direction or a redundant path. With this, it is possible to reduce inductance components of the conduction paths connecting the first switching element 1A and the second switching element 1B to the first capacitor 3A, and suppress a surge voltage. The configuration in which the first capacitor 3A overlaps with both the first switching element 1A and the second switching element 1B as viewed in the z direction can prevent a situation in which the first capacitor 3A is arranged unnecessarily far away from the first switching element LA and the second switching element 1B, and such a configuration is preferable for reducing the inductance components.

The semiconductor device A1 includes the first capacitor 3A. Accordingly, a circuit substrate (not shown) or the like on which e.g. the semiconductor device A1 is mounted does not need to be provided with a conduction path for connection to the first capacitor 3A. This is suitable for suppressing a surge voltage, and is also advantageous for reducing the mounting area of the circuit substrate.

Superior rapid responsiveness is realized if the first switching element 1A and the second switching element 1B are so-called GaN-HEMTs, and thus the time rate of change in current is significantly large. In the semiconductor device A1, the inductance component is reduced due to the above-described arrangement of the first capacitor 3A. Accordingly, it is possible to suppress a surge voltage while maintaining the rapid responsiveness of the semiconductor device A1.

A configuration in which the first lead 2A, the second lead 2B, and the third lead 2C are used to respectively realize the first conductive member, the second conductive member, and the third conductive member of the present disclosure increases the degree of freedom of the three-dimensional arrangement of the first conductive member, the second conductive member, and the third conductive member, and such a configuration is preferable for realizing low resistance and low inductance. Specifically, a configuration in which the first portion 21A, the second portion 22A, and the third portion 23A, as well as the first portion 21B, the second portion 22B, and the third portion 23B are used to realize, as shown in FIGS. 6 and 10, a ring-shaped conduction path that surrounds the first switching element LA and the second switching element 1B as viewed in the x direction is preferable for reducing the inductance components.

The first gate electrode 12A, the first source electrode 13A, and the first drain electrode 14A of the first switching element 1A, and the second gate electrode 12B, the second source electrode 13B, and the second drain electrode 14B of the second switching element 1B are arranged on a common side in the z direction. This ensures a configuration in which the first portion 21A, the first portion 21B, the first portion 21C, the second portion 22C, the fourth lead 2D, and the fifth lead 2E are arranged such that their positions in the z direction generally correspond to each other. This is advantageous in reducing the size of the semiconductor device A1 in the z direction. This is also advantageous in reducing the inductance components.

Figure 15:
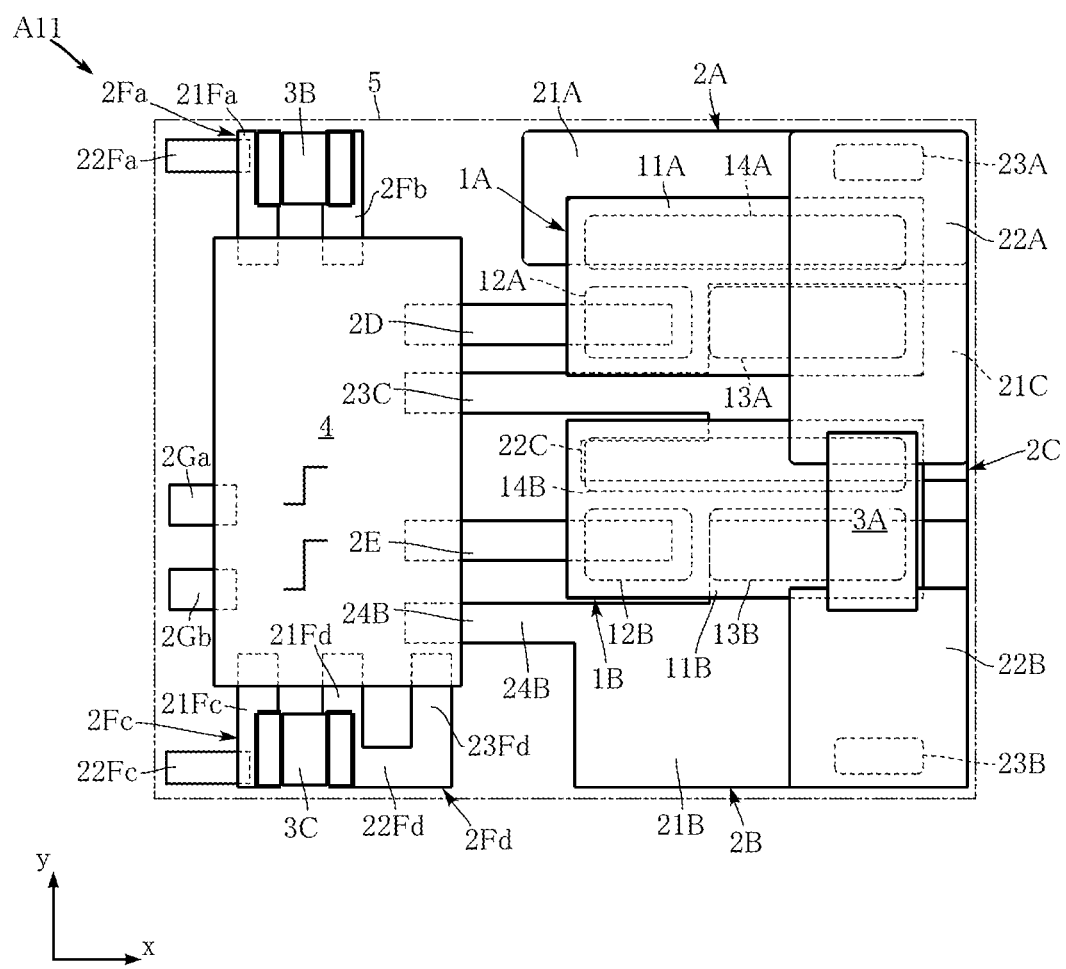
FIG. 15 is a plan view illustrating a modification of the semiconductor device according to the first embodiment of the present disclosure.

FIG. 15 shows a modification of the semiconductor device A1. Note that in FIG. 15, the same reference numerals as those in the above-described embodiment are given to elements that are the same as or similar to those in the above-described embodiment. In a semiconductor device A11 of this modification, the first capacitor 3A overlaps with the second switching element 1B as viewed in the z direction, and does not overlap with the first switching element 1A. Even with such a configuration, it is possible to suppress a surge voltage. Also, as is clear from the present modification, the first capacitor 3A needs only to overlap with one of the first switching element LA and the second switching element 1B as viewed in the z direction, and may be configured to overlap with only the first switching element LA, for example.

The semiconductor device according to the present disclosure is not limited to the above-described embodiments. Various design changes can be made to the specific configuration of the components of the semiconductor device according to the present disclosure.

The configuration that uses the first lead 2A, the second lead 2B, the third lead 2C, the fourth lead 2D, and the fifth lead 2E is an example of the configuration that uses the first conductive member, the second conductive member, the third conductive member, the fourth conductive member, and the fifth conductive member of the present disclosure, and the specific configurations of the first conductive member, the second conductive member, the third conductive member, the fourth conductive member, and the fifth conductive member of the present disclosure are in no way limited. For example, a configuration is also possible that includes a plate-shaped substrate made of Cu or the like, and a wiring layer that is stacked on one or both sides of the substrate with an insulating layer interposed therebetween, and uses a component built-in substrate in which predetermined elements (such as, for example, a first and second switching elements) are arranged in voids formed in the base material. In this case, the wiring layer may also be provided with another element (such as, for example, a first capacitor). The elements built in the base material and the wiring layer are conductive to each other via, for example, a through conductive part that extends in the thickness direction. With the elements, the wiring layer, and the through conductive part as described above, it is possible to configure a circuit part equivalent to the circuit part of the above-described embodiment that is constituted by the first portion 21A, the third portion 23A, the second portion 22A, the first capacitor 3A, the second portion 22B, the third portion 23B, and the first portion 21B.

Clause 1.

A semiconductor device comprising:
  a first terminal and a second terminal;
  a first switching element including a first gate electrode, a first source electrode, and a first drain electrode; and
  a second switching element including a second gate electrode, a second source electrode, and a second drain electrode,
  wherein the first switching element and the second switching element are connected in series to each other between the first terminal and the second terminal,
  the semiconductor device further comprising a first capacitor connected in parallel to the first switching element and the second switching element between the first terminal and the second terminal,
  wherein the first switching element and the second switching element are disposed in a first direction, and
  the first capacitor overlaps with at least one of the first switching element and the second switching element as viewed in a second direction perpendicular to the first direction.

Clause 2.

The semiconductor device according to claim 1, wherein the first capacitor overlaps with the first switching element and the second switching element as viewed in the second direction.

Clause 3.

The semiconductor device according to claim 1 or 2, wherein the first switching element and the second switching element have a flat shape having a thickness direction corresponding to the second direction.

Clause 4.

The semiconductor device according to claim 3, wherein the first gate electrode, the first source electrode, and the first drain electrode are disposed opposite to the first capacitor in the second direction.

Clause 5.

The semiconductor device according to claim 4, wherein the second gate electrode, the second source electrode, and the second drain electrode are disposed opposite to the first capacitor in the second direction.

Clause 6.

The semiconductor device according to claim 5, further comprising:
  a first conductive member electrically connected to the first drain electrode and the first capacitor; and
  a second conductive member electrically connected to the second source electrode and the first capacitor.

Clause 7.

The semiconductor device according to claim 6, wherein the first conductive member includes: a first portion conductively bonded to the first drain electrode; and a second portion that is disposed opposite to the first portion with respect to the first switching element in the second direction and is conductively bonded to the first capacitor.

Clause 8.

The semiconductor device according to claim 7, wherein the second conductive member includes: a first portion conductively bonded to the second drain electrode; and a second portion that is disposed opposite to the first portion of the second conductive member with respect to the second switching element in the second direction and is conductively bonded to the first capacitor.

Clause 9.

The semiconductor device according to claim 8, wherein the first conductive member includes a third portion that is disposed opposite to the second switching element with respect to the first switching element in the first direction, the third portion coupling the first portion of the first conductive member to the second portion of the first conductive member.

Clause 10.

The semiconductor device according to claim 9, wherein the second conductive member includes a third portion that is disposed opposite to the first switching element with respect to the second switching element in the first direction, the third portion coupling the first portion of the second conductive member to the second portion of the second conductive member.

Clause 11.

The semiconductor device according to claim 10, further comprising a third conductive member conductively bonded to the first source electrode and the second drain electrode.

Clause 12.

The semiconductor device according to claim 11, wherein the third conductive member is disposed between the first portion of the first conductive member and the first portion of the second conductive member in the first direction.

Clause 13.

The semiconductor device according to claim 12, further comprising an integrated circuit element disposed on a side of the first switching element and the second switching element in a third direction perpendicular to the first direction and the second direction.

Clause 14.

The semiconductor device according to claim 13, further comprising a fourth conductive member connected to the first gate electrode and the integrated circuit element.

Clause 15.

The semiconductor device according to claim 14, further comprising a fifth conductive member connected to the second gate electrode and the integrated circuit element.

Clause 16.

The semiconductor device according to claim 15, further comprising: a first lead forming the first conductive member; a second lead forming the second conductive member; a third lead forming the third conductive member; a fourth lead forming the fourth conductive member; and a fifth lead forming the fifth conductive member.

Clause 17.

The semiconductor device according to any one of claims 13 to 16, wherein the first switching element and the second switching element comprise a semiconductor layer made of a GaN semiconductor.

The invention claimed is:

1. A semiconductor device comprising:
 a first terminal and a second terminal;
 a first switching element including a first element body, a first gate electrode, a first source electrode, and a first drain electrode; and
 a second switching element including a second element body, a second gate electrode, a second source electrode, and a second drain electrode,
 wherein the first switching element and the second switching element are connected in series to each other between the first terminal and the second terminal,
 the semiconductor device further comprising a first capacitor connected in parallel to the first switching element and the second switching element between the first terminal and the second terminal,
 wherein the first switching element and the second switching element are disposed in a first direction,
 the first capacitor is disposed in proximity to the first switching element and the second switching element as viewed in a second direction perpendicular to the first direction,
 the first element body includes a first obverse surface and a first reverse surface, the first obverse surface being closer to the first capacitor than is the first reverse surface in the second direction,
 the second element body includes a second obverse surface and a second reverse surface, the second obverse surface being closer to the first capacitor than is the second reverse surface in the second direction,
 the first gate electrode, the first source electrode, and the first drain electrode are disposed on the first reverse surface, and
 the second gate electrode, the second source electrode, and the second drain electrode are disposed on the second reverse surface.

2. The semiconductor device according to claim 1, wherein the first capacitor is disposed above the first switching element and the second switching element in the second direction.

3. The semiconductor device according to claim 1, wherein the first capacitor overlaps with at least one of the first switching element and the second switching element as viewed in the second direction.

4. The semiconductor device according to claim 1, wherein the first switching element and the second switching element have a flat shape having a thickness direction corresponding to the second direction.

5. The semiconductor device according to claim 1, further comprising:
 a first conductive member electrically connected to the first drain electrode and the first capacitor; and
 a second conductive member electrically connected to the second source electrode and the first capacitor.

6. The semiconductor device according to claim 5, wherein the first conductive member includes: a first portion conductively bonded to the first drain electrode; and a second portion that is disposed opposite to the first portion with respect to the first switching element in the second direction and is conductively bonded to the first capacitor.

7. The semiconductor device according to claim 6, wherein the second conductive member includes: a first portion conductively bonded to the second drain electrode; and a second portion that is disposed opposite to the first portion of the second conductive member with respect to the second switching element in the second direction and is conductively bonded to the first capacitor.

8. The semiconductor device according to claim 7, wherein the first conductive member includes a third portion that is disposed opposite to the second switching element with respect to the first switching element in the first direction, the third portion coupling the first portion of the first conductive member to the second portion of the first conductive member.

9. The semiconductor device according to claim 8, wherein the second conductive member includes a third portion that is disposed opposite to the first switching element with respect to the second switching element in the first direction, the third portion coupling the first portion of the second conductive member to the second portion of the second conductive member.

10. The semiconductor device according to claim 9, further comprising a third conductive member conductively bonded to the first source electrode and the second drain electrode.

11. The semiconductor device according to claim 10, wherein the third conductive member is disposed between the first portion of the first conductive member and the first portion of the second conductive member in the first direction.

12. The semiconductor device according to claim 11, further comprising an integrated circuit element disposed on a side of the first switching element and the second switching element in a third direction perpendicular to the first direction and the second direction.

13. The semiconductor device according to claim 12, further comprising a fourth conductive member connected to the first gate electrode and the integrated circuit element.

14. The semiconductor device according to claim 13, further comprising a fifth conductive member connected to the second gate electrode and the integrated circuit element.

15. The semiconductor device according to claim 14, further comprising: a first lead forming the first conductive member; a second lead forming the second conductive member; a third lead forming the third conductive member; a fourth lead forming the fourth conductive member; and a fifth lead forming the fifth conductive member.

16. The semiconductor device according to claim 12, wherein the first switching element and the second switching element comprise a semiconductor layer made of a GaN semiconductor.

* * * * *